(12) United States Patent
Endo et al.

(10) Patent No.: US 7,575,431 B2
(45) Date of Patent: Aug. 18, 2009

(54) VERTICAL HEAT PROCESSING APPARATUS AND METHOD FOR USING THE SAME

(75) Inventors: Atsushi Endo, Nirasaki (JP); Yoshiyuki Fujita, Nirasaki (JP); Shinji Miyazaki, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 1 day.

(21) Appl. No.: 11/822,282

(22) Filed: Jul. 3, 2007

(65) Prior Publication Data
US 2008/0008566 A1    Jan. 10, 2008

(30) Foreign Application Priority Data
Jul. 7, 2006    (JP)    ............... 2006-188714

(51) Int. Cl.
*F27D 1/00*    (2006.01)
(52) U.S. Cl. ................ 432/245; 432/251; 219/390; 118/725
(58) Field of Classification Search ............... 432/239, 432/241, 245, 247, 251; 118/724, 725, 729; 219/390, 405, 411; 392/416, 418
See application file for complete search history.

(56) References Cited
U.S. PATENT DOCUMENTS
1,863,185 A * 6/1932 Bunce et al. ............... 432/251
5,482,558 A * 1/1996 Watanabe et al. .......... 118/728
5,482,559 A * 1/1996 Imai et al. .................. 118/728
5,520,742 A * 5/1996 Ohkase ...................... 118/724
2006/0216941 A1* 9/2006 Hasebe et al. .............. 438/715
2006/0286817 A1 12/2006 Kato et al.

FOREIGN PATENT DOCUMENTS
JP    2000-026973    1/2000

* cited by examiner

*Primary Examiner*—Gregory A Wilson
(74) *Attorney, Agent, or Firm*—Smith, Gambrell & Russell, LLP (57) ABSTRACT

A vertical heat processing apparatus for performing a heat process on a plurality of target substrates all together includes a vertical process container configured to accommodate the target substrates and having a transfer port at a bottom; a holder configured to support the target substrates at intervals in a vertical direction inside the process container; and a heater disposed around the process container, and configured to supply heat rays through a sidewall of the process container, so as to heat an interior of the process container. A thermal buffer member is disposed between the heater and a lower end side of the process container to surround the lower end side, and is configured to decrease transmissibility of the lower end side for heat rays between the heater and target substrates inside the process container.

19 Claims, 7 Drawing Sheets

VERTICAL HEAT PROCESSING APPARATUS AND METHOD FOR USING THE SAME

BACKGROUND OF THE INVENTION

1. Field of the Invention

The present invention relates to a vertical heat processing apparatus for a semiconductor process for performing a heat process on target substrates, such as semiconductor wafers, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer (made of, e.g., silicon) is subjected to various processes, such as film formation, etching, oxidation, diffusion, reformation, annealing, and natural oxide film removal. Jpn. Pat. Appln. KOKAI Publications No. 2000-26973 and US 2006/0286817 A1 disclose a vertical heat processing apparatus (of the so-called batch type), which performs a heat process on a plurality of semiconductor wafers all together. According to this apparatus, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rates, process pressures, and process temperatures, are controlled.

BRIEF SUMMARY OF THE INVENTION

An object of the present invention is to provide a vertical heat processing apparatus and a method for using the apparatus, which can suppress such a phenomenon that microcracks are generated on the lower end side of a process container in long-term use due to over-response of a heater control system, which has been found by the present inventors, as described later.

According to a first aspect of the present invention, there is provided a vertical heat processing apparatus for performing a heat process on a plurality of target substrates all together, the apparatus comprising:

a vertical process container configured to accommodate the target substrates and having a transfer port at a bottom;

a holder configured to support the target substrates at intervals in a vertical direction inside the process container;

a lid configured to open and airtightly close the transfer port;

an elevating mechanism configured to move up and down the lid with the holder supported thereon, so as to load and unload the holder into and from the process container through the transfer port;

a gas supply system configured to supply a process gas into the process container;

an exhaust system configured to exhaust gas from inside the process container;

a heater disposed around the process container, and configured to supply heat rays through a sidewall of the process container, so as to heat an interior of the process container; and a thermal buffer member disposed between the heater and a lower end side of the process container to surround the lower end side, and configured to decrease transmissibility of the lower end side for heat rays between the heater and target substrates inside the process container.

According to a second aspect of the present invention, there is provided a vertical heat processing apparatus for performing a heat process on a plurality of target substrates all together, the apparatus comprising:

a vertical process container configured to accommodate the target substrates and having a transfer port at an end in a vertical direction;

a holder configured to support the target substrates at intervals in a vertical direction inside the process container;

a lid configured to open and airtightly close the transfer port;

an elevating mechanism configured to move up and down the lid with the holder supported thereon, so as to load and unload the holder into and from the process container through the transfer port, a gas supply system configured to supply a process gas into the process container;

an exhaust system configured to exhaust gas from inside the process container;

a plurality of heaters disposed around the process container respectively for a plurality of zones inside the process container arrayed in a vertical direction, and configured to supply heat rays through a sidewall of the process container, so as to heat the zones inside the process container;

a plurality of temperature sensors disposed respectively for the zones;

a control section configured to respectively control set temperatures of the heaters with reference to detection data obtained by the temperature sensors; and a thermal buffer member disposed between an end heater of the heaters closest to the transfer port and the process container to surround the lower end side, and configured to set a second transmissibility for heat rays between the end heater and target-substrates inside the process container to be smaller than the a first transmissibility for heat rays between the other heaters and target substrates inside the process container.

According to a third aspect of the present invention, there is provided a method for using a vertical heat processing apparatus for performing a heat process on a plurality of target substrates all together, the apparatus comprising a vertical process container configured to accommodate the target substrates and having a transfer port at an end in a vertical direction, a holder configured to support the target substrates at intervals in a vertical direction inside the process container, a lid configured to open and airtightly close the transfer port, an elevating mechanism configured to move up and down the lid with the holder supported thereon, so as to load and unload the holder into and from the process container through the transfer port, a gas supply system configured to supply a process gas into the process container, an exhaust system configured to exhaust gas from inside the process container, a plurality of heaters disposed around the process container respectively for a plurality of zones inside the process container arrayed in a vertical direction, and configured to supply heat rays through a sidewall of the process container, so as to heat the zones inside the process container, a plurality of temperature sensors disposed respectively for the zones, and a control section configured to respectively control set temperatures of the heaters with reference to detection data obtained by the temperature sensors, and the method comprising:

disposing a thermal buffer member between an end heater of the heaters closest to the transfer port and the process container to surround the process container, thereby setting a second transmissibility for heat rays between the end heater and target substrates inside the process container to be smaller than the a first transmissibility for heat rays between the other heaters and target substrates inside the process container; and loading or unloading the holder into or from the process container through the transfer port, while heating the process container by the heaters, and respectively controlling set temperatures of the heaters in accordance with detection data obtained by the temperature sensors, wherein the thermal buffer member is used to suppress an oscillation phenomenon of a set temperature of the end heater when loading or unloading the holder.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF-DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the process of developing the present invention, the inventors studied problems caused in vertical heat processing apparatuses, as those disclosed in Jpn. Pat. Appln. KOKAI Publications No. 2000-26973 and US 2006/0286817 A1 described above. As a result, the inventors have arrived at the findings given below.

Figure 6:
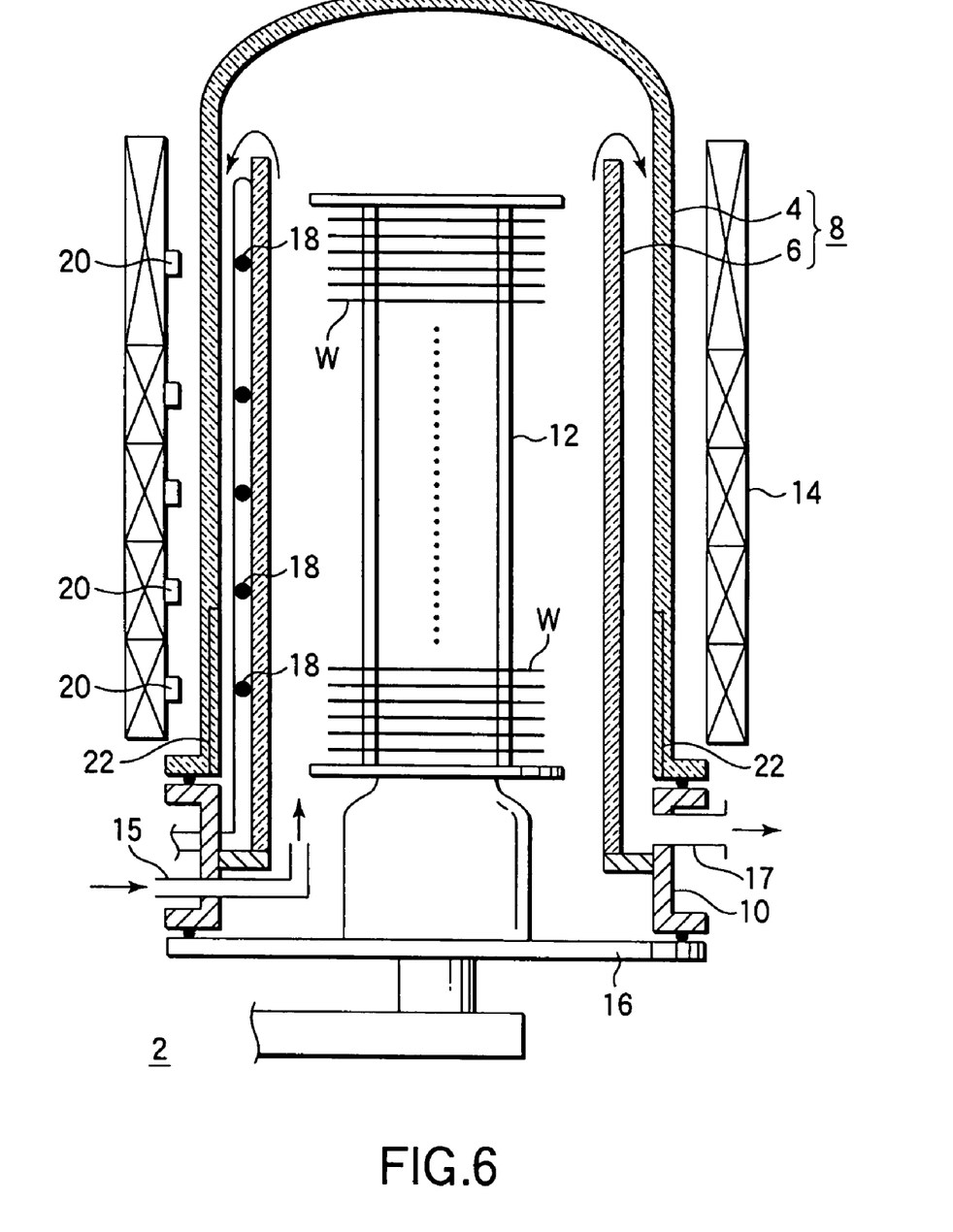
FIG. 6 is a sectional view showing a vertical heat processing apparatus used as a comparative example for the present invention.

FIG. 6 is a sectional view showing a vertical heat processing apparatus used as a comparative example for the present invention. The heat processing apparatus 2 includes a process container 8 having a double-tube structure, which is formed of an outer tube 4 made of quartz with a ceiling and a cylindrical inner tube 6 made of quartz and disposed inside the outer tube 4. A cylindrical manifold 10 made of, e.g., stainless steel is connected to the bottom of the outer tube 4. The inner tube 6 is configured to accommodate a wafer boat 12, which is loaded and unloaded from and to a position therebelow. The wafer boat 12 can support a number of, e.g., about 150, product wafers W at predetermined regular intervals in the vertical direction. The manifold 10 defines a transfer port at the bottom, which is airtightly closed by a lid 16. In this state, a predetermined heat process, such as CVD (Chemical Vapor Deposition) process is performed.

A plurality of cylindrical heaters 14 are disposed around the process container 8 to heat the wafer W from outside. The process filed inside the process container 8 is divided into to a plurality of zones, such as five zones, in the vertical direction, which are respectively provided with the heaters 14. Further, inner thermocouples 18 are arrayed in the vertical direction inside the process container 8 to measure the temperatures of the respective zones. Similarly, outer thermocouples 20 are disposed near the heaters 14 of the respective zones. The set temperatures of the heaters are respectively controlled with reference to detection values obtained by the inner and outer thermocouples 18 and 20.

The manifold 10 is connected to gas nozzles 15 (FIG. 6 shows only one nozzle, although a plurality of nozzles are disposed in accordance with the type of gases), from which various process gases, such as film formation gases, are supplied. Each of the process gases is supplied into the process container 8 from below, and flows upward while causing a reaction within the process field set as a high temperature area inside the inner tube 6. Then, the process gas turns around and flows downward through the gap between the inner tube 6 and outer tube 4, and is exhausted outside from an exhaust port 17 formed in the manifold 10.

During the heat process, the semiconductor wafers are maintained at a predetermined process temperature, while the interior of the process container is maintained at a predetermined process pressure. Process gases supplied into the process container flow upward, i.e., in the wafer array direction, along the peripheral edges of the wafers, while parts of them flow into the gaps between the wafers W. These parts cause a thermal decomposition reaction and thereby deposit a film on the surface of the wafers. For example, where a poly-crystalline film is formed, a silane family gas, such as monosilane, and hydrogen gas are used as the process gases.

When the process container 8 is in an idling state, the inside temperature thereof is set at, e.g., about 500° C. lower than the process temperature of, e.g., about 65° C. When the process is started, the wafer boat 12 with wafers W supported thereon at room temperature is loaded into the process container 8 from the transfer port at the bottom of the manifold 10.

At this time, the lid 16 of the manifold 10 of the process container 8 is opened, and the wafer boat 12 is gradually moved up through the transfer port. Accordingly, the powers supplied to the zone heaters are respectively controlled to prevent a decrease in temperature. Particularly, the power supplied to the heater for the lowermost zone is rapidly increased to compensate for heat dissipation from portions around it.

Figure 7:
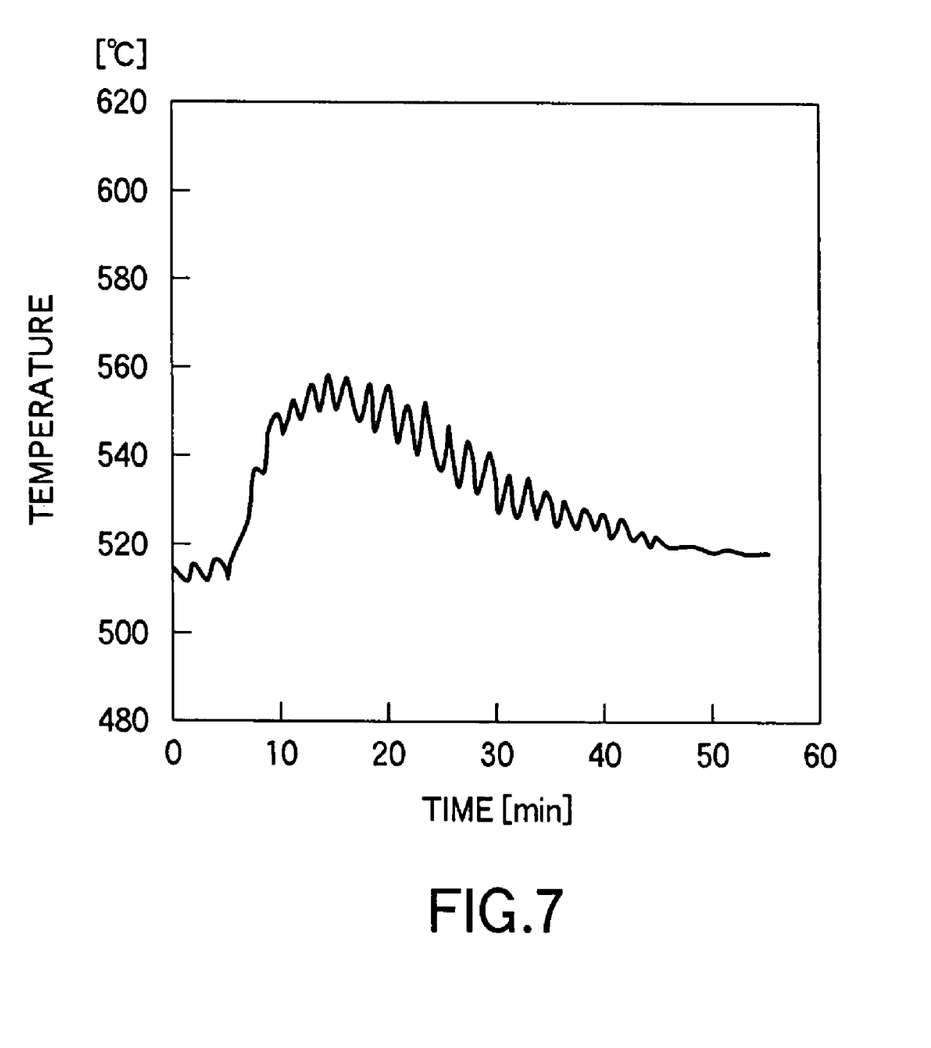
FIG. 7 is a graph showing a change in temperature detected by an outer thermocouple at the lowermost zone during wafer loading in the apparatus shown in FIG. 6.

FIG. 7 is a graph showing a change in temperature detected by the outer thermocouple 20 at the lowermost zone during wafer loading in the apparatus shown in FIG. 6. In FIG. 7, the temperature of the process container and heaters are basically set at 500° C. Since the heat of the heaters is transmitted very well, the lowermost zone heater quickly repeats an increase and a decrease in temperature, as shown in FIG. 7. In other words, an oscillation phenomenon of the set temperature is caused in this heater for temperature compensation. Due to this temperature oscillation phenomenon, quartz that forms the outer tube 4 frequently repeats thermal expansion and contraction particularly on the lower end side of the outer tube 4 corresponding to the lowermost zone. Consequently, micro-cracks 22 are generated on this portion.

If such micro-cracks 22 are generated, the service life of the process container 8 (outer tube 4) is shortened. Further, unnecessary thin films formed and engaged with the minute micro-cracks 22 are difficult to remove by a cleaning process. Part of the thin films engaged with the micro-cracks 22 may be occasionally peeled off and generate particles, which reduce the yield of products.

In order to solve the problem described above, it may be adopted to adjust the control constant of a control system, such as a PID control, for controlling the temperature. However, judging from the experience, optimization of the control constant entails a very difficult adjustment and thus is not a practical solution.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
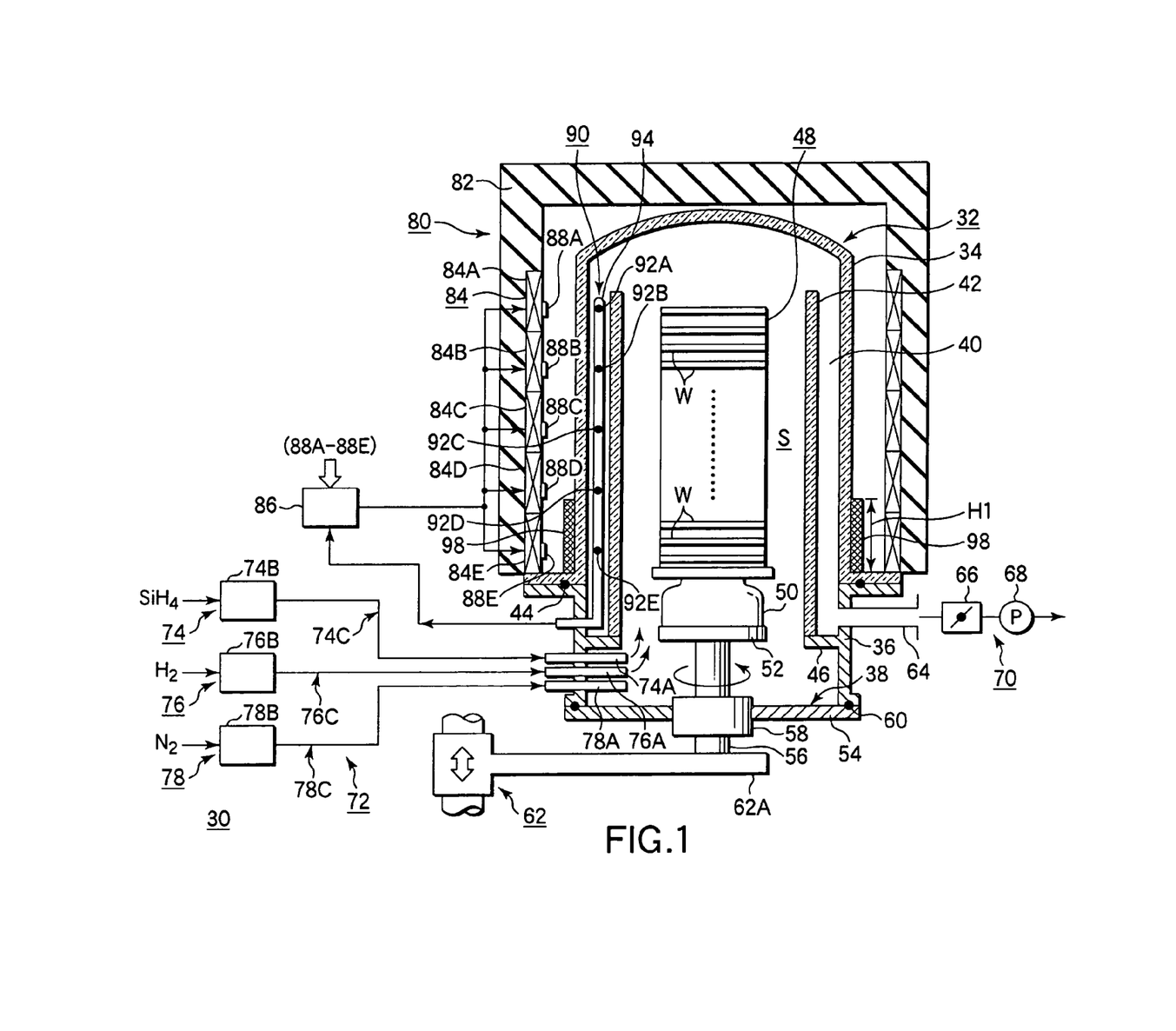
FIG. 1 is a sectional view showing a vertical heat processing apparatus (vertical film formation apparatus) according to an embodiment of the present invention.
Figure 2:
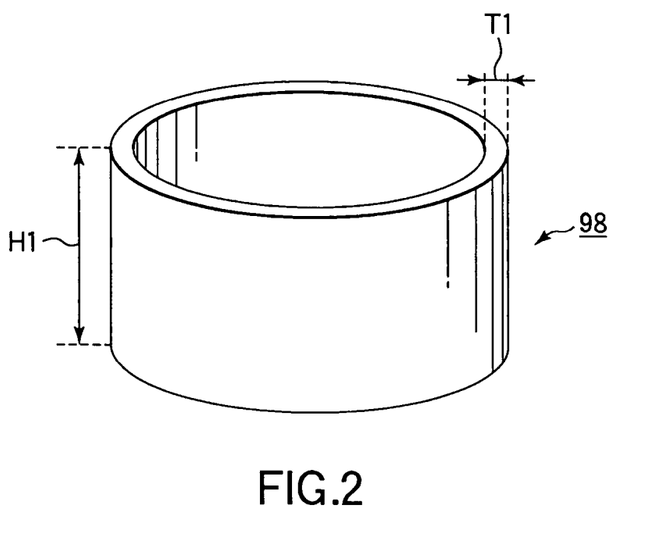
FIG. 2 is a perspective view showing a thermal buffer member used in the apparatus shown in FIG. 1.

FIG. 1 is a sectional view showing a vertical heat processing apparatus (vertical film formation apparatus) according to an embodiment of the present invention. FIG. 2 is a perspective view showing a thermal buffer member used in the apparatus shown in FIG. 1. Hereinafter, an explanation will be given of a case where a heat process is performed to form a poly-crystalline film by a CVD method using monosilane ($SiH_4$) and hydrogen.

The heat processing apparatus 30 includes a cylindrical vertical process container 32. The process container 32 has a cylindrical outer tube 34 made of transparent quartz with a ceiling and an opened bottom. A short cylindrical manifold 36 made of, e.g., stainless steel is connected to the bottom of the outer tube 34. The manifold 36 defines a transfer port 38 at the bottom, through which a wafer boat 48 is loaded and unloaded into and from the process container 32. A cylindrical inner tube 42 made of transparent quartz is coaxially disposed inside the outer tube 34 with a small gap 40 interposed between them. Accordingly, the process container 32 has a double-tube structure formed of the outer tube 34 and inner tube 42. The bottom of the outer tube 34 is connected through a seal member 44, such as an O-ring, to the top of the manifold 36 to airtightly seal this portion. The bottom of the inner tube 42 is supported by a support projection 46 extending inward from the inner surface of the manifold 36.

The process container 32 is configured to accommodate a wafer boat 48 made of transparent quartz for supporting a plurality of semiconductor wafers W at intervals in the vertical direction. In this embodiment, the wafer boat 48 can support, e.g., about 50 to 100 wafers W having a diameter of 300 mm at essentially regular intervals in the vertical direction. The size and number of wafers W to be accommodated in the process container 32A are not limited to this example, and wafers W having a diameter of 200 mm may be used, for example.

The wafer boat 48 is placed on a rotary table 52 through a heat-insulating cylinder 50 made of quartz. The rotary table 52 is supported by a rotary shaft 56, which penetrates a lid 54 for opening and closing the transfer port at the bottom of the manifold 36.

The portion of the lid 54 where the rotary shaft 56 penetrates is provided with, e.g., a magnetic-fluid seal 58, so that the rotary shaft 56 is rotatably supported in an airtightly sealed state. A seal member 60, such as an O-ring, is interposed between the periphery of the lid 54 and the bottom of the manifold 36, so that the interior of the process container 32 can be kept sealed.

The rotary shaft 56 is attached at the distal end of an arm 62A supported by an elevating mechanism 62, such as a boat elevator. The elevating mechanism 62 moves the wafer boat 48 and lid 54 up and down in unison, so that the wafer boat 48 are loaded and unloaded into and from the process container 32. The manifold 36 has an exhaust port 64 formed in the sidewall to exhaust the atmosphere from inside the process container 32 through the bottom of the gap 40 between the outer tube 34 and inner tube 42. The exhaust port 64 is connected to a vacuum-exhaust system 70 including a pressure regulation valve 66, a vacuum pump 68, and so forth.

A gas supply section 72 is connected to the sidewall of the manifold 36 to supply various gases into the inner tube 42. Specifically, the gas supply section 72 includes a silane family gas supply circuit 74, a reduction gas supply circuit 76, and an inactive gas supply circuit 78. The gas supply circuits 74, 76, and 78 respectively include gas nozzles 74A, 76A, and 78A, which penetrate the sidewall of the manifold 36.

The gas nozzles 74A, 76A, and 78A are respectively connected to gas passages 74C, 76C, and 78C respectively provided with flow rate controllers 74B, 76B, and 78B, such as mass flow controllers. With this arrangement, the silane family gas, reduction gas, and inactive gas can be supplied at controlled flow rates. In this embodiment, for example, monosilane is used as the silane family gas, $H_2$ gas is used as the reduction gas, and $N_2$ gas is used as the inactive gas (also used for purging). In this embodiment, the process container 32 has an inner diameter of about 450 mm and a height of about 1,400 mm.

A heating mechanism 80 is disposed to surround the process container 32. Specifically, the heating mechanism 80 includes a cylindrical heat-insulating casing 82 and a heater array 84 disposed on the inner surface of the casing 82 to face the sidewall of the process container 32. The process filed inside the process container 32 is divided into to a plurality of zones, such as five zones, in the vertical direction, and the heater array 84 includes a plurality of zone heaters 84A, 84B, 84C, 84D, and 84E corresponding to the five zones.

Outer thermocouples 88A to 88E are respectively disposed as temperature sensors near the zone heaters 84A to 84E, and correspond to the respective zones inside the process container 32. Further, a temperature detection mechanism 90 is disposed inside the process container 32 to detect the temperature of the wafer W. The temperature detection mechanism 90 includes a quartz pipe 94 that envelops a plurality of, e.g., five inner thermocouples 92A to 92E corresponding to the respective zones. The quartz pipe 94 extends vertically in the gap 40 between the outer tube 34 and inner tube 42 to detect the temperature of the wafers corresponding to the respective zones.

The zone heaters 84A to 84E, outer thermocouples 88A to 88E, and inner thermocouples 92A to 92E are connected to a main control section 86 formed of, e.g., a micro computer. The main control section 86 adjusts powers supplied to the zone heaters 84A to 84E to respectively control the set temperatures of the heaters. The detection data obtained by the inner thermocouples 92A to 92E is used for adjusting the set temperatures of the zone heaters 84A to 84E. On the other hand, the detection data obtained by the outer thermocouples 88A to 88E is used for confirming the operation of the zone heaters 84A to 84E.

A thermal buffer member 98 is disposed on the lower end side between the sidewall of the outer tube 34 and the heating mechanism 80. The thermal buffer member 98 is formed of a circular ring or cylindrical tube body having a uniform height and a uniform thickness and disposed coaxially with the process container 32. The thermal buffer member 98 surrounds the outer tube 34 to cover the lowermost zone and part of the second lowermost zone of the five zones. The thermal buffer member 98 is preferably disposed to cover the entire region where the micro-cracks 22 are generated, as shown in FIG. 6. However, in light of temperature control for the wafers W, the thermal buffer member 98 may be disposed to cover only the lowermost zone.

The thermal buffer member 98 provides a second transmissibility for heat rays between the lowermost zone heater 84E and wafers W inside the process container 34, which is smaller than a first transmissibility for heat rays between the other zone heaters 84A to 84D and wafers W inside the process container 34. The second transmissibility is set to be 10 to 80%, and preferably set to be 20 to 70% of the first transmissibility. The transmissibility of the thermal buffer member 98 for heat rays is set to be 10 to 80%, and preferably 20 to 70%.

The thermal buffer member 98 mitigates the heat transmission from the lowermost zone heater 84E to wafers W inside the corresponding zone. For example, the height H1 of the thermal buffer member 98 is set to be about 5 to 50 cm, and preferably to be 20 to 40 cm, although it depends on the elevating speed of the wafer boat into the process container 32 in wafer loading and the height of the process container 32. If the height H1 exceeds 50 cm, the heat transmissibility may be decreased too much to an undesirably level. If the height H1 is smaller than 5 cm, the thermal buffer member 98 may be insufficient to provide an expected effect.

Further, for example, the thickness T1 of the thermal buffer member 98 is set to be about 2 to 6 mm, and preferably to be 2 to 5 mm, although it depends on the material of the member 98. If the thickness T1 is smaller than 2 mm, the thermal buffer member 98 may be insufficient to provide an expected effect. If the thickness T1 is larger than 6 mm, the temperature increasing rate at the portion corresponding to the thermal buffer member 98 may become too low when heating the wafers W. The material of the thermal buffer member 98 is selected from heat-resistant materials, which are opaque and cause no contamination, such as opaque quartz and opaque ceramic materials. For example, such ceramic materials encompass SiC, $Al_2O_3$, and SiN.

The main control section 86 controls not only the temperature, as described above, but also the operation of the entire apparatus. The main control section 86 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 86 can control the elevating mechanism 62, gas supply section 72, exhaust system 70, heating mechanism 80, and so forth, based on the stored process recipe and control data.

Figure 8:
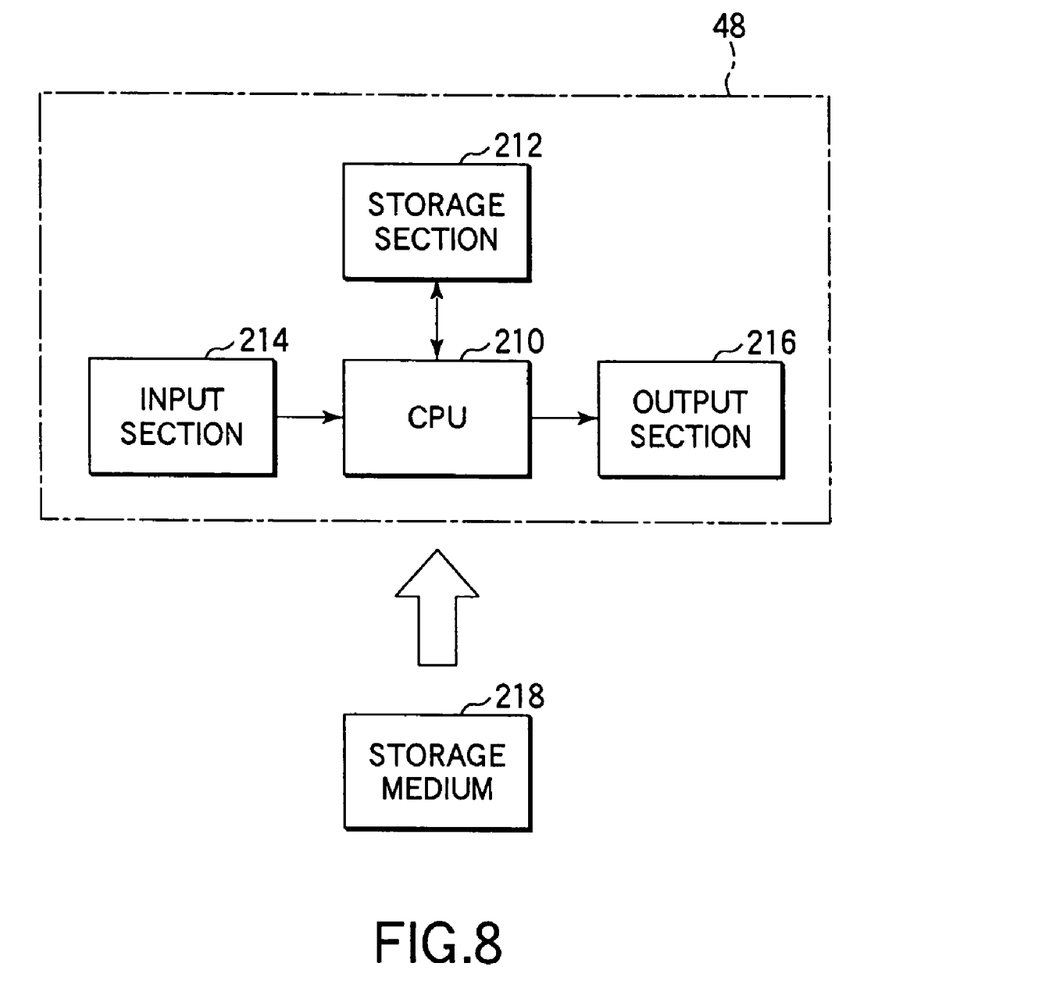
FIG. 8 is a block diagram schematically showing the structure of a main control section used in the apparatus shown in FIG. 1.

FIG. 8 is a block diagram schematically showing the structure of the main control section 86 of the apparatus shown in FIG. 1. The main control section 86 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 8 also shows a storage medium 218 attached to the computer in a removable state.

The film formation method described below may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described below.

Next, an explanation will be given of a film formation method performed in the apparatus shown in FIG. 1.

When the film formation apparatus 30 is in an idling state without wafers loaded therein, the interior of the process container 32 is maintained at a temperature of, e.g., 500° C. lower than the process temperature. When the process is started, the wafer boat 48 with a number of wafers W, such as 100 wafers W, supported thereon at room temperature is loaded into the process container 32 from the transfer port 38 at the bottom of the manifold 36. After the wafer boat 48 is loaded, the transfer port 38 of the manifold 36 is closed by the lid 54 to set the container in an airtight state.

Then, the interior of the process container 32 is vacuum-exhausted and kept at a predetermined process pressure, and the wafer temperature is increased to a process temperature for film formation. At this time, the apparatus is in a waiting state until the temperature becomes stable. Then, $SiH_4$ gas and $H_2$ gas are supplied from the gas supply section 72 respectively at predetermined flow rates to perform the film formation process. In this embodiment, since a poly-crystalline film is formed, the process temperature is set at, e.g., about 600° C.

In this process, the wafer temperatures in the respective zones of the process container 32 are detected by the inner thermocouples 92A to 92E disposed inside the process container 32. Further, the heater temperatures are detected by the outer thermocouples 88A to 88E used as temperature sensors disposed near the zone heaters 84A to 84E. Based on the detection values, the main control section 86 adjusts powers supplied to the zone heaters 84A to 84E to independently control the wafer temperatures of the respective zones.

When the wafer boat 48 is being loaded into the process container 32, the elevating speed thereof is set to be, e.g., about 10 cm/min to 50 cm/min, although it depends on the height of the process container 32 and the number of wafers supported on the wafer boat 48. During this wafer loading, temperature control is performed to maintain the respective zones of the process container 32 at about 500° C. The elevating speed of the wafer boat 48 is very slow, and the wafers W are gradually moved up while being heated.

At this time, rapid heat dissipation is caused at the lower end side of the process container 32 near the transfer port 38 of the manifold 36, because this portion need to continuously heat the wafers W initially set at room temperature. Accordingly, the power supplied to the lowermost zone heater 48E is increased to compensate for this heat dissipation, thereby radiating a large amount of heat.

In the case of the film formation apparatus according to the comparative example described with reference to FIGS. 6 and 7, the outer tube 4 and inner tube 6 made of transparent quartz efficiently transmit heat rays. Accordingly, the inner and outer thermocouples 18 and 20 sensitively detect the increase and decrease of heat radiation from the heaters, and thereby bring about a temperature oscillation phenomenon while performing temperature compensation.

In this respect, according to the film formation apparatus 30 shown in FIG. 1, the thermal buffer member 98, which is formed of an opaque ring-like or cylindrical body, is disposed on the lower end side between the outer tube 34 and the heating mechanism 80. In this case, the sensitivity of the inner thermocouple 92E for detecting the increase and decrease of heat radiation from the zone heater 84E becomes lower to some extent, although the heat transmissibility of this zone is slightly decreased. This makes it possible to suppress occurrence of such an oscillation phenomenon that the lowermost zone heater 84E quickly repeats an increase and a decrease in heat radiation. Thus, the lower end side of the quartz outer tube 34 is prevented from suffering generation of micro-cracks.

In other words, when the wafers are loaded into the process container 32, temperature compensation is performed, while the lowermost zone heater 84E particularly increases heat radiation. At this time, as described above, the thermal buffer member 98 serves to suppress occurrence of an oscillation phenomenon of heat radiation. Consequently, it is possible to prevent quartz that forms the outer tube 34 from frequently repeating thermal expansion and contraction, thereby preventing generation of micro-cracks.

<Experiment>

An experiment was conducted to compare an apparatus according to a present example having the structure shown in FIG. 1 with an apparatus according to a comparative example having the structure shown in FIG. 7 in terms of temperature change at the lowermost zone in wafer loading. In this experiment, the temperature inside the process container was set at 500° C., and the elevating speed for wafer loading was set at 10 cm/min.

Figure 3:
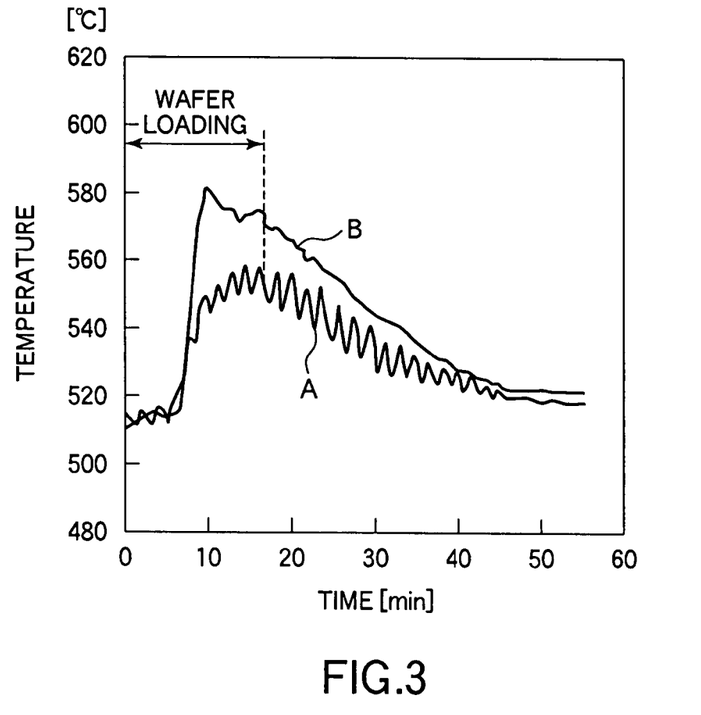
FIG. 3 is a graph showing the relationship between the elapsed time from a start of wafer loading and the temperature detected by an outer thermocouple at the lowermost zone, in apparatuses according to a comparative example and a present example.
Figure 4A:
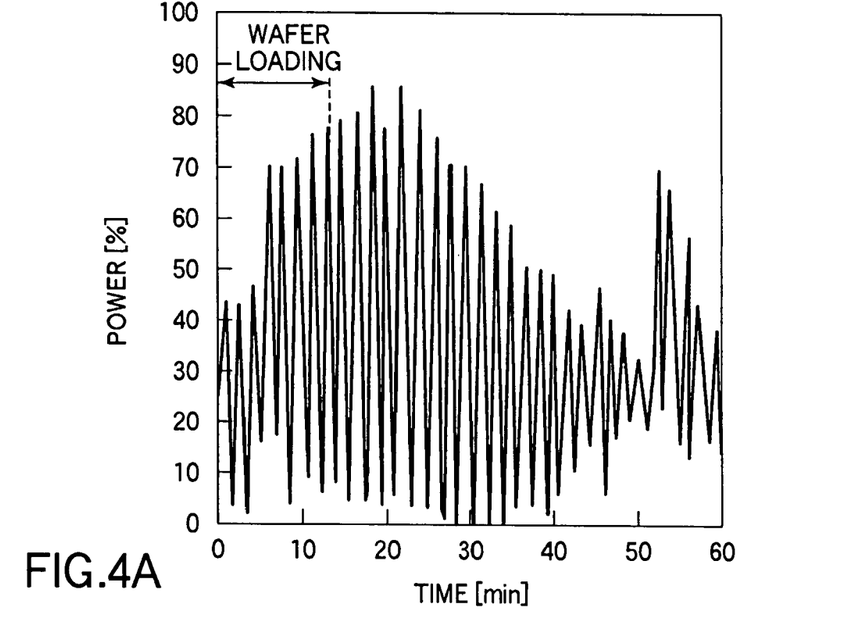
FIG. 4A is a graph showing the relationship between the elapsed time from the start of wafer loading and the supply power to the lowermost zone heater, in the apparatus according to the comparative example.
Figure 4B:
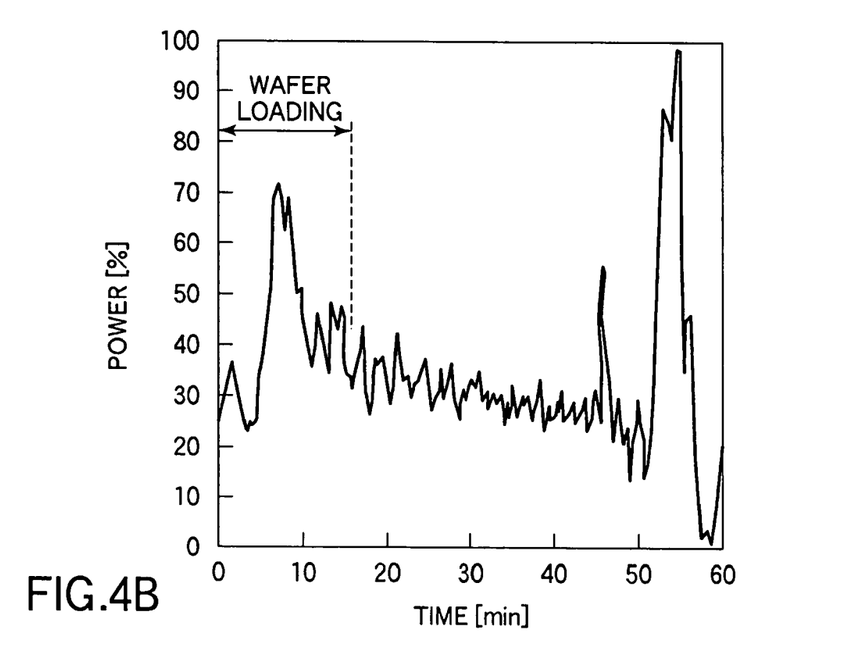
FIG. 4B is a graph showing the relationship between the elapsed time from the start of wafer loading and the supply power to the lowermost zone heater, in the apparatus according to the present example.

FIG. 3 is a graph showing the relationship between the elapsed time from a start of wafer loading and the temperature detected by the outer thermocouple 20 or 88E at the lowermost zone, in the apparatuses according to the comparative example and present example. In FIG. 3, the line A denotes a temperature change obtained by the apparatus according to the comparative example (the same as the line shown in FIG. 7), while the line B denotes a temperature change obtained by the apparatus according to the present example. FIG. 4A is a graph showing the relationship between the elapsed time from the start of wafer loading and the supply power to the lowermost zone heater, in the apparatus according to the comparative example. FIG. 4B is a graph showing the relationship between the elapsed time from the start of wafer loading and the supply power to the lowermost zone heater, in the apparatus according to the present example.

As indicated by the line A in FIG. 3, in the apparatus according to the comparative example, temperature compensation was performed until the temperature was stabilized after the start of wafer loading, while the detection value obtained by the outer thermocouple quickly repeated an increase and a decrease, i.e., the heater set temperature caused an oscillation. In this case, as shown in FIG. 4A, the heater supply power was oscillated with a large amplitude in a short time.

On the other hand, as indicated by the line B in FIG. 3, in the apparatus according to the present example, temperature compensation was performed until the temperature was stabilized after the start of wafer loading, while the detection value obtained by the outer thermocouple scarcely caused an oscillation, i.e., the heater set temperature was less fluctuated. In this case, as shown in FIG. 4B, the heater supply power was oscillated only with a small amplitude, i.e., the supply power was relatively stable, as compared to the case shown in FIG. 4A. However, in the case of the apparatus according to the present example, as indicated by the line B in FIG. 3, the thermocouple showed a slightly higher temperature, because the transmissibility for heat rays was decreased by that much corresponding to the thermal buffer member 98.

After the experiment described above was conducted, visual observation was performed on the process container of the apparatus according to the comparative example and the process container of the apparatus according to the present example. In the apparatus according to the comparative example, a lot of micro-cracks were generated on the lower end side of the process container and made it like ground-glass. On the other hand, in the apparatus according to the present example, the process container maintained high transparency.

As described above, according to this embodiment, the opaque thermal buffer member 98 is disposed on the lower end side between the quartz outer tube 34 of the vertical process container 32 and the heating mechanism 80 surrounding the outer tube 34, so that heat transmissibility at the lower end side of the outer tube 34 is decreased. Consequently, it is possible to suppress occurrence of such an oscillation phenomenon that temperature quickly repeats an increase and a decrease, so as to prevent the lower end side of the process container 32 from suffering generation of micro-cracks.

In the embodiment described above, the process container 32 includes the manifold 36 made of stainless steel. However, the manifold 36 may be made of transparent quartz. Alternatively, the process container 32 may be integrally formed from transparent quartz without a manifold 36 separately formed. In the embodiment described above, the process container 32 has a double-tube structure formed of the outer tube 34 and inner tube 42. However, the present invention may be similarly applied to a process container having a single-tube structure.

Figure 5:
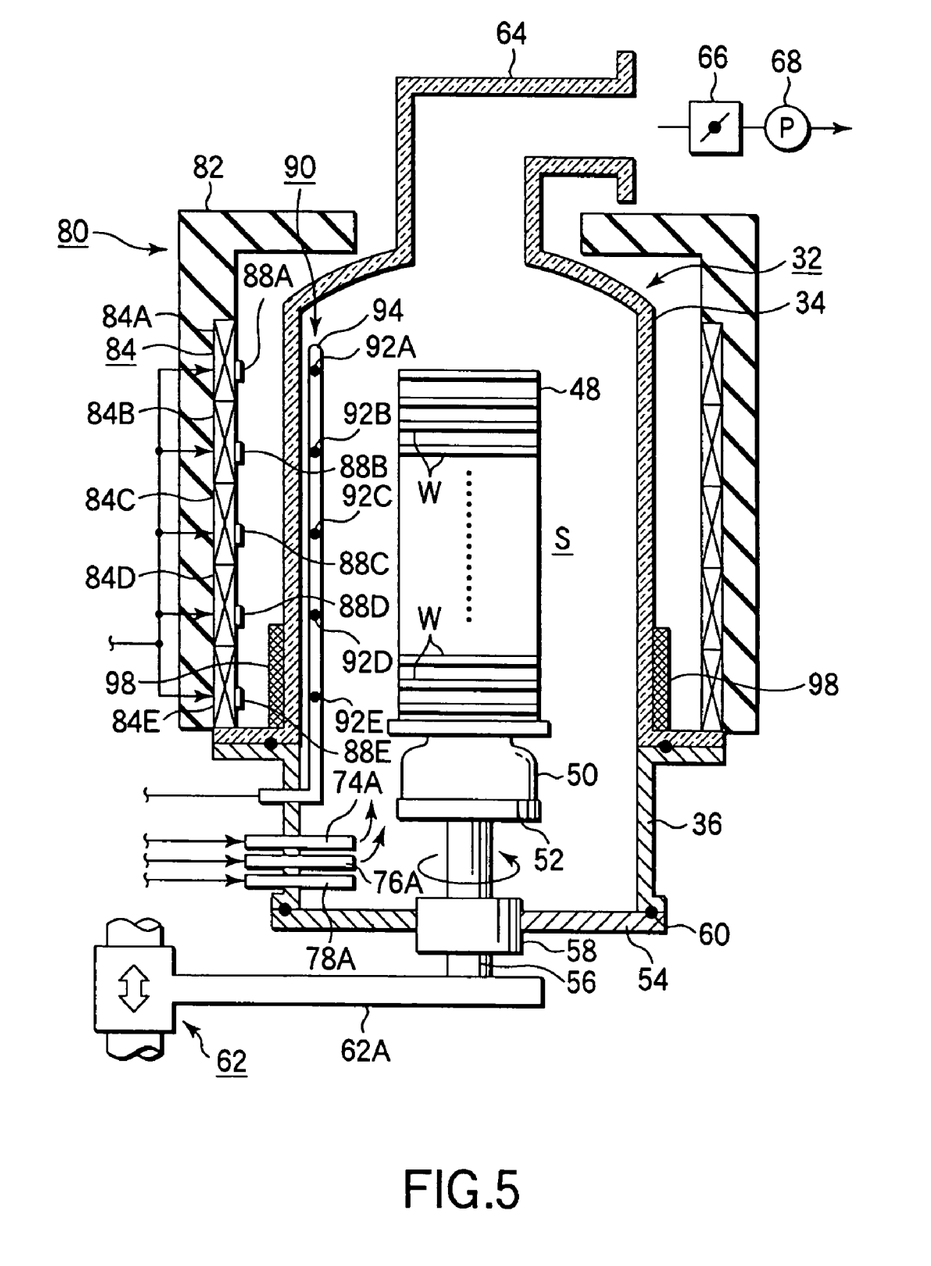
FIG. 5 is a sectional view showing a vertical heat processing apparatus (vertical film formation apparatus) including a process container having a single-tube structure according to another embodiment of the present invention.

FIG. 5 is a sectional view showing a vertical heat processing apparatus (vertical film formation apparatus) including a process container having a single-tube structure according to another embodiment of the present invention. In the apparatus shown in FIG. 5, the process container 32 does not include an inner tube 42, but includes only an outer tube 34. The process container 32 has an exhaust port 64 formed at the ceiling. A thermal buffer member 98 is disposed on the lower end side between the outer tube 34 and a heating mechanism 80 surrounding the outer tube 34. The effect of the thermal buffer member 98 is the same as that described with reference to the former embodiment. Also in this case, the manifold 36 may be made of transparent quartz and/or integrally formed with outer tube 34. A process container 32 having a single-tube structure may be arranged such that a gas is supplied from the ceiling and exhausted from a lower position of the sidewall of the process container 32.

In the embodiment described above, monosilane is used as the silane family gas. Alternatively, desilane or dichlorsilane may be used as the silane family gas. Further, a doping gas may be used for doping phosphorous or boron as an impurity. In the embodiment described above, the heat process is exemplified by a process for forming a poly-crystalline film. Alternatively, the present invention may be applied to a process for forming anther film, such as an amorphous silicon film, $SiO_2$ film, or SiN film. Further, the present invention may be applied to another heat process, such as oxidation, diffusion, reformation, or annealing. The target substrate may be a substrate other than a semiconductor wafer, such as a glass substrate, LCD-substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vertical heat processing apparatus for performing a heat process on a plurality of target substrates all together, the apparatus comprising:
    a vertical process container configured to accommodate the target substrates and having a transfer port at a bottom;
    a holder configured to support the target substrates at intervals in a vertical direction inside the process container;
    a lid configured to open and airtightly close the transfer port;
    an elevating mechanism configured to move up and down the lid with the holder supported thereon, so as to load and unload the holder into and from the process container through the transfer port;
    a gas supply system configured to supply a process gas into the process container;
    an exhaust system configured to exhaust gas from inside the process container;
    a heater disposed around the process container, and configured to supply heat rays through a sidewall of the process container, so as to heat an interior of the process container;
    a thermal buffer member disposed between the heater and a lower end side of the process container to surround the lower end side, and configured to decrease transmissibility of the lower end side for heat rays between the heater and target substrates inside the process container;
    a temperature sensor disposed between the thermal buffer member and target substrates inside the process container; and
    a control section configured to control a set temperature of the heater with reference to detection data obtained by the temperature sensor.

2. The apparatus according to claim 1, wherein the process container is cylindrical, and the thermal buffer member is disposed coaxially with the process container.

3. The apparatus according to claim 1, wherein the thermal buffer member has a height of 5 to 50 cm.

4. The apparatus according to claim 1, wherein the thermal buffer member consists essentially of opaque quartz or an opaque ceramic material.

5. The apparatus according to claim 1, wherein the thermal buffer member consists essentially of a ceramic material selected from the group consisting of SiC, $Al_2O_3$, and SiN.

6. The apparatus according to claim 1, wherein the thermal buffer member has a uniform height and a uniform thickness.

7. The apparatus according to claim 1, wherein the temperature sensor is disposed inside the process container.

8. The apparatus according to claim 1, wherein the control section is configured to control a power supplied to the heater with reference to detection data obtained by the temperature sensor.

9. The apparatus according to claim 1, wherein the process container comprises a metal ring manifold and a reaction tube made of transparent quartz and connected to the manifold, such that the transfer port is defined by the manifold, and the lower end side defined by the reaction tube.

10. A vertical heat processing apparatus for performing a heat process on a plurality of target substrates all together, the apparatus comprising:
    a vertical process container configured to accommodate the target substrates and having a transfer port at an end in a vertical direction;
    a holder configured to support the target substrates at intervals in a vertical direction inside the process container;
    a lid configured to open and airtightly close the transfer port;
    an elevating mechanism configured to move up and down the lid with the holder supported thereon, so as to load and unload the holder into and from the process container through the transfer port;
    a gas supply system configured to supply a process gas into the process container;
    an exhaust system configured to exhaust gas from inside the process container;
    a plurality of heaters disposed around the process container respectively for a plurality of zones inside the process container arrayed in a vertical direction, and configured to supply heat rays through a sidewall of the process container, so as to heat the zones inside the process container;
    a plurality of temperature sensors disposed respectively for the zones;
    a control section configured to respectively control set temperatures of the heaters with reference to detection data obtained by the temperature sensors; and
    a thermal buffer member disposed between an end heater of the heaters closest to the transfer port and the process container to surround the lower end side, and configured to set a second transmissibility for heat rays between the end heater and target substrates inside the process container to be smaller than a first transmissibility for heat rays between the other heaters and target substrates inside the process container.

11. The apparatus according to claim 10, wherein the thermal buffer member consists essentially of opaque quartz or an opaque ceramic material.

12. The apparatus according to claim 10, wherein the thermal buffer member consists essentially of a ceramic material selected from the group consisting of SiC, $Al_2O_3$, and SiN.

13. The apparatus according to claim 10, wherein an end temperature sensor of the temperature sensors corresponding to the end heater is disposed between the thermal buffer member and target substrates inside the process container.

14. The apparatus according to claim 10, wherein the control section is configured to respectively control powers supplied to the heaters with reference to detection data obtained by the temperature sensors.

15. The apparatus according to claim 10, wherein the transfer port is formed at a lower end of the process container.

16. The apparatus according to claim 15, wherein the process container comprises a metal ring manifold and a reaction tube made of transparent quartz and connected to the manifold, such that the transfer port is defined by the manifold, and the end heater is disposed around a lower end side of the reaction tube.

17. The apparatus according to claim 10, wherein the thermal buffer member has a transmissibility of 10 to 80% for heat rays.

18. The apparatus according to claim 10, wherein the second transmissibility is 10 to 80% of the first transmissibility.

19. A method for using a vertical heat processing apparatus for performing a heat process on a plurality of target substrates all together, the apparatus comprising
a vertical process container configured to accommodate the target substrates and having a transfer port at an end in a vertical direction,
a holder configured to support the target substrates at intervals in a vertical direction inside the process container,
a lid configured to open and airtightly close the transfer port,
an elevating mechanism configured to move up and down the lid with the holder supported thereon, so as to load and unload the holder into and from the process container through the transfer port,
a gas supply system configured to supply a process gas into the process container,
an exhaust system configured to exhaust gas from inside the process container,
a plurality of heaters disposed around the process container respectively for a plurality of zones inside the process container arrayed in a vertical direction, and configured to supply heat rays through a sidewall of the process container, so as to heat the zones inside the process container,
a plurality of temperature sensors disposed respectively for the zones, and
a control section configured to respectively control set temperatures of the heaters with reference to detection data obtained by the temperature sensors, and the method comprising:
disposing a thermal buffer member between an end heater of the heaters closest to the transfer port and the process container to surround the process container, thereby setting a second transmissibility for heat rays between the end heater and target substrates inside the process container to be smaller than a first transmissibility for heat rays between the other heaters and target substrates inside the process container; and
loading or unloading the holder into or from the process container through the transfer port, while heating the process container by the heaters, and respectively controlling set temperatures of the heaters in accordance with detection data obtained by the temperature sensors,
wherein the thermal buffer member is used to suppress an oscillation phenomenon of a set temperature of the end heater when loading or unloading the holder.

* * * * *